United States Patent
Pearson

(10) Patent No.: US 6,836,231 B2
(45) Date of Patent: Dec. 28, 2004

(54) SIGNAL GENERATOR

(75) Inventor: Richard David Pearson, Bristol (GB)

(73) Assignee: Radiodetection Limited, Bristol (GB)

( * ) Notice: Subject to any disclaimer, the term of this patent is extended or adjusted under 35 U.S.C. 154(b) by 0 days.

(21) Appl. No.: 10/609,674

(22) Filed: Jul. 1, 2003

(65) Prior Publication Data

US 2004/0070444 A1 Apr. 15, 2004

Related U.S. Application Data

(62) Division of application No. 09/870,106, filed on May 30, 2001, now Pat. No. 6,717,392.

(51) Int. Cl.[7] .............................................. H03M 3/00
(52) U.S. Cl. .................... 341/143; 324/76.11; 324/624; 330/10
(58) Field of Search ....................... 341/143; 324/76.11, 324/624; 330/10; 323/284; 219/130.51; 702/60, 62, 64

(56) References Cited

U.S. PATENT DOCUMENTS

| | | | |
|---|---|---|---|
| 5,077,539 A | | 12/1991 | Howatt |
| 5,537,333 A | * | 7/1996 | Hemminger et al. .......... 702/60 |
| 5,544,089 A | * | 8/1996 | Hemminger et al. .......... 702/64 |
| 5,548,527 A | * | 8/1996 | Hemminger et al. .......... 702/62 |
| 5,555,508 A | * | 9/1996 | Munday et al. ............... 702/60 |
| 5,617,058 A | | 4/1997 | Adrian et al. |
| 5,777,512 A | | 7/1998 | Tripathi et al. |
| 5,909,153 A | * | 6/1999 | Delano et al. .............. 332/107 |
| 6,111,216 A | * | 8/2000 | Stava .................... 219/130.51 |
| 6,717,392 B2 | * | 4/2004 | Pearson ................... 324/76.11 |
| 6,734,656 B2 | * | 5/2004 | Miller et al. ................ 323/284 |

FOREIGN PATENT DOCUMENTS

| | | |
|---|---|---|
| EP | 0525777 A1 | 2/1993 |
| EP | 0892495 A2 | 1/1999 |
| EP | 0825456 A3 | 7/2000 |
| JP | 10233634 | 2/1998 |

* cited by examiner

Primary Examiner—Patrick Wamsley
(74) Attorney, Agent, or Firm—Baker & Hostetler LLP

(57) ABSTRACT

A signal generator controls power output on the basis of the output from a Δ-Σ modulator or oscillator. That output may be generated in real time by the modulator or oscillator and fed to a switch control logic unit which controls a power switching stage to output switchably switched power from a power supply to an output, preferably via a filter. Alternatively the output of a Δ-Σ oscillator or modulator may be stored in a switchable memory to be retrieved when needed. A further alternative is to control the power switching stage by a processor with a program which reproduces the control effect of the Δ-Σ oscillator/modulator. Feedback from the output may be used to control the Δ-Σ modulator/oscillator and/or the power supply.

2 Claims, 10 Drawing Sheets

SIGNAL GENERATOR

CROSS-REFERENCE TO RELATED APPLICATIONS

This application claims priority to U.S. patent application entitled, SIGNAL GENERATOR, filed May 30, 2001, having Ser. No. 09/870,106 now U.S. Pat. No. 6,717,392 the disclosure of which is hereby incorporated by reference.

BACKGROUND OF THE INVENTION

1. Field of the Invention

The present invention relates to a signal generator. It is particularly concerned with a signal generator for applying a signal to a conductive cable or pipe, particularly but not exclusively, to such a cable or pipe buried underground.

2. Summary of the Prior Art

It is well known to determine the location of an underground cable or pipe by detecting the magnetic field generated by an alternating current carried by such a cable or pipe. Thus, for example, EP-A-0825456 discloses an arrangement for detecting the condition of a buried metal pipeline in which an alternating signal is applied to the pipe and detected at the surface by a suitable detector.

In order for such a magnetic field to be detected, it is usually necessary for a suitable alternating signal to be applied to the pipe or cable, and a signal generator is used to do this. The output of the generator is coupled to the pipe or cable using one of three methods: by making a direct connection, by using an induction coil which induces a current in the conductor, and by using a toroidal clamp around the pipe or cable which induces current by a transformer effect.

The ground impedance associated with the cable or pipe varies greatly depending on site conditions and so the magnitude of the current in the cable or pipe is frequency dependent. The use of higher frequencies enables more signal current to be driven along the cable or pipe but that signal decreases more rapidly with distance along the conductor or pipe from the generator than a low frequency signal. The optimum operating frequency thus depends on the length of the cable or pipe and the ground impedance, how the latter is distributed along the cable or pipe, and how far the operator wishes to trace the cable or pipe.

Therefore, the generator needs to be capable of generating a range of frequencies. Moreover, as a result of the wide range of ground impedances, the generator also needs to be capable of operating over a wide load impedance range, from short-circuit to open-circuit, including any combination of resistive, capacitive and inductive reactances. It is also usually necessary for the generator to be portable.

Generators are known which employ a waveform synthesiser to produce a sinusoidal waveform that is applied to an input a class AB amplifier. The frequency generated by the synthesiser is controlled by a microprocessor, which also controls a variable power supply to the synthesiser, which power supply determines the amplitude of the waveform generated. Whilst it is possible to make such an arrangement compact, and relatively inexpensive, it has the disadvantage that its power efficiency is low, typically of the order of 50% Since the generator, if portable, is usually powered by a battery, this produces significant drain on battery life, and also has the disadvantage of making the generator produce more heat than is desirable.

SUMMARY OF THE INVENTION

The present invention seeks to provide a generator suitable e.g. for applying a signal to a cable or pipe, and at its most general proposes that the signal is generated by a delta-sigma modulator or oscillator. The output of that modulator or oscillator may then be passed via a power switching stage and an output filter to generate the output of the generator. Is has been found that the use of such a delta-sigma oscillator or modulator enables greater energy efficiency to be achieved in the power switching stage.

The present invention has four aspects, each comprising a generator and a method of generating signals using such a generator. In the first aspect, a waveform synthesiser is used to generate a desired waveform, which is input to a delta-sigma modulator. In the second aspect, the separate waveform generator may be omitted, by the use of a delta-sigma oscillator to replace the waveform generator and the delta-sigma modulator. Each of these two aspects are "real-time", in that they assume that the signal is being generated at the time at which it is output. However, in the third aspect, a signal is generated using either the combination of waveform generator and delta-sigma modulator, or a delta-sigma oscillator, and a suitable sample of that waveform is stored in a memory of the generator for subsequent retrieval at the time the output is to be generated.

In the fourth aspect of the invention, a delta-sigma modulator or oscillator is used to generate a control program for controlling the power switching stage so that control program is then stored in a memory of the generator for subsequent retrieval at the time the output is to be generated.

In each of the above aspects, the delta-sigma modulator and the waveform generator (if any) can be a digital circuit.

Delta-sigma modulators and oscillators (hereinafter $\Delta$-$\Sigma$ modulators and oscillators) are known devices in which an input is passed to a quantizer via an integrator and the quantized output feeds back to subtract from the input signal. This feedback causes the average value of the quantized signal to track the average value of the input signal. Any persistent difference accumulates in the integrator and eventually corrects itself.

Thus, the $\Delta$-$\Sigma$ system can be considered to be formed by the series connection of at least one accumulator and a quantizer, each of which involves a feedback signal. $\Delta$-$\Sigma$ modulators may have multiple accumulator stages, and even possibly multiple quantizer stages. The number of stages of accumulation are referred to as the "orders" of the $\Delta$-$\Sigma$ modulator, when there is a single quantizer stage, so that such a modulator with one accumulation stage is referred to as a first-order $\Delta$-$\Sigma$ modulator, one with two such accumulation stages is referred to as a second-order $\Delta$-$\Sigma$ modulator, etc.

In such an arrangement, in which the signal generated by a $\Delta$-$\Sigma$ modulator or oscillator is passed via a power switching stage and output filtered to generate the output to a load, the control of the generator output can be achieved in several different ways. The generator output current, power or voltage can be fed back to the $\Delta$-$\Sigma$ modulator or oscillator, to control it, or the output current, power or voltage can be fed back to the power supply controlling the power switching to achieve a similar effect. It is also possible to control the output of the generator on the basis of the power supply current, power or voltage delivered to power the switching stage. Another possibility would be to use current, voltage or power regulation in the power supply and yet another possibility would be to control the amplitude of the waveform generator.

BRIEF DESCRIPTION OF THE DRAWING

Embodiments of the present invention will now be described in detail, by way of example, with a reference to the accompanying drawings, in which.

DETAILED DESCRIPTION

Figure 1:
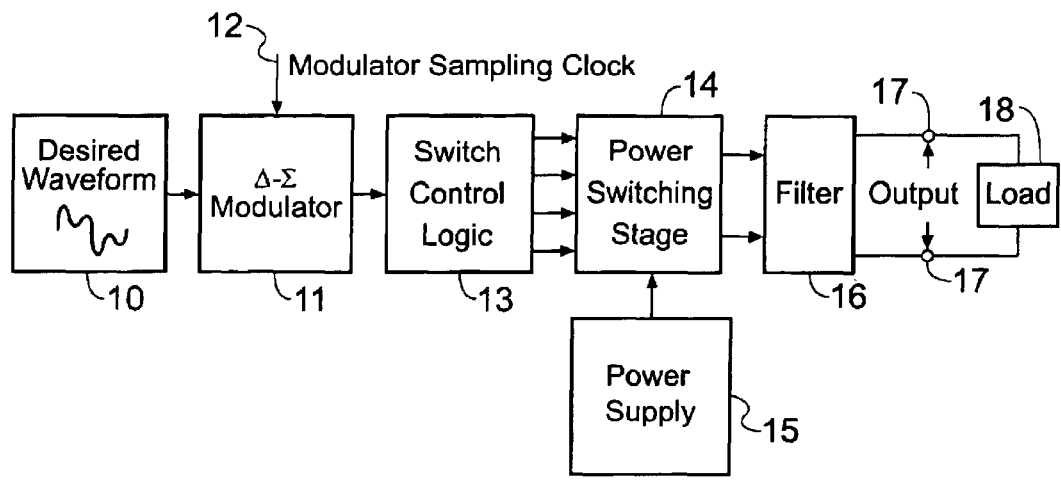
FIG. 1 is a schematic block diagram of a generator according to a first embodiment of the present invention.

Referring first to FIG. 1, a generator embodying the present invention comprises five stages. The first stage is a waveform generator 10 which, possibly in digital form, generates an output waveform. The waveform generator passes the waveform thus generated to a Δ-Σ modulator 11 which also receives a sampling clock signal 12. The output of the Δ-Σ modulator is passed via a switch control logic stage 13 to a power switching stage 14 controlled by a power supply 15, and the output of the power switching stage 14 is passed via an output filter 16 to output terminals 17 and hence to a load 18. As previously mentioned, when this generator is used to supply signals to a cable or pipe, the load 18 may be the cable or pipe itself, or may be a coil or toroidal clamp which induces signals in the cable or pipe.

This is an important feature of the embodiment that a Δ-Σ modulator 11 is used, and the action of such a modulator will now described with reference to FIG. 2, which illustrates a first-order Δ-Σ modulator. In such a modulator, an input signal $x_i$ is passed via a delay or accumulator stage 20 to a quantization stage 21, which receives the signal $e_i$ from the sampling clock 12 and generates an output $y_i$. That output $y_i$ is fed back to the input, and is subtracted from the input signal $x_i$ at a subtractor 22. Moreover, the output $w_i$ from the delay at stage 20 is fed back to an adder 23 which also receives the output of the subtractor 22 before forming the input to the delay stage 20.

Figure 2:
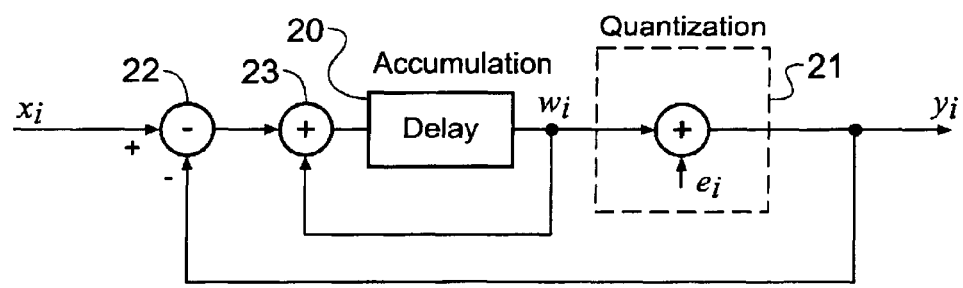
FIG. 2 is a schematic diagram of a first-order Δ-Σ modulator which may be used in the embodiment of FIG. 1.

In the modulator of FIG. 2, Δ-Σ modulation is produced at the output of the quantization stage 21. The quantization stage 21 compares the signal at its input with a fixed reference level at the moment when the sampling clock pulse $e_i$ occurs and accordingly sets the output level. In essence the instantaneous output is fed back and subtracted from the input to produce an error signal. The delay stage 20 and inner feedback loop formed by the feedback of signal $w_i$ to the adder 23 perform a process of accumulation that is analogous to integration in the continuous time domain. The average value of the error signal is derived in this integrator and is fed to the input of the quantization stage 21. This feedback system forces the average value of the error signal to zero and hence the average value of the quantized output signal is made to track the average input value. Over the long term, the action of the integrator keeps error in the average output of a Δ-Σ modulator very small.

The noise-shaping property of Δ-Σ modulation can be used to advantage if the signal frequency is small compared to the frequency of the sampling clock 12. In this case most of the noise is outside the signal bandwidth and can be removed by low-pass filtering at the output. The ratio of the Nyquist frequency, which is equal to half the frequency of the sampling clock 12, to the maximum signal frequency (normally equal to the bandwidth) is called the oversampling ratio (OSR) The signal to noise ratio is a function of the OSR; increasing the OSR increases the signal to noise ratio. The signal to noise ratio (SNR) of a Δ-Σ modulator expressed in decibels (dB) is:

$$(S/N)_{db} = 20\log\left\{\left(\frac{3}{2}\right)^{\frac{1}{2}}\left(\frac{(2L+1)^{\frac{1}{2}}}{\pi^L}\right)(Q-1)R^{(L+\frac{1}{2})}\right\}$$

where L is the order of the Δ-Σ modulator,

Q is the number of output quantization levels,

R is the oversampling ratio, defined as $R=f_s/2f_o$, where $f_s$ is the sampling clock frequency and $f_o$ is the output signal bandwidth.

From the equation the following can be observed:

a Increasing the number of quantization levels from Q=2 to Q=3 improves the SNR by 6 dB. This could be realised using a full bridge output stage Doubling the oversampling ratio R improves the signal to noise ratio by 6(L+0.5) dB, e.g. when L=2 the improvement is 15 dB.

High order modulators can achieve high signal to noise ratio at relatively low OSR. For example, increasing the order of the modulator from L=2 to L=3 improves the signal to noise ratio by 10 dB when R=8 or by 14 dB when R=16.

In order to minimise power loss in the power switching stage 13, it is desirable to have a low switching frequency.

To keep the switching frequency low it is necessary to have a relatively low OSR. It can be seen from above that to achieve a large SNR at low OSR a high order Δ-Σ modulator is desirable. Realisation of a second order modulator (L=2) is fairly straightforward as shown by FIG. 3, but higher order modulators (L>2) are more difficult to implement.

Figure 3:
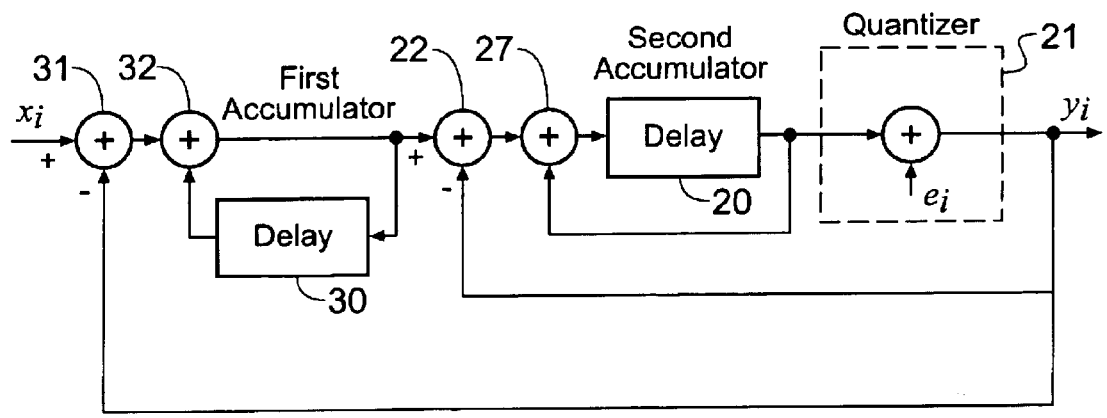
FIG. 3 is a schematic block diagram, of a second-order Δ-Σ modulator which may be used in the embodiment of FIG. 1.

Thus, FIG. 3 illustrates a second-order Δ-Σ modulator in which the Δ-Σ modulator of FIG. 2 is modified by the addition of a further delay stage 30, the output of which is fed to the subtractor 22 and the input of which receives the input signal $x_i$ and the output signal $y_i$ via an additional subtractor 31. The output of the delay stage 30 is fed to an adder 32 which also receives the output of the subtractor 31.

The minimum required OSR is calculated assuming a minimum required SNR of 40 dB, a second-order modulator (L=2) and a full bridge output stage providing three-level output quantization (Q=3). This gives R=8.0.

Setting the signal bandwidth at 16 kHz leads to a required sampling clock frequency of 256 kHz; the average switching rate will be lower than this due to the non-return to zero (NRZ) property of Δ-Σ modulation, leading to almost negligible switching energy losses in the output stage.

Digital techniques are highly suitable for the implementation of Δ-Σ modulators, due to the time quantization involved.

The delta-sigma modulator 11 produces an output ($y_i$ in FIGS. 2 and 3) that can either have two levels or three. That output must be then translated by the switch control logic stage 13 into control signals for controlling the power switching stage 14. In order to understand those control signals it is first necessary to consider the structure of the power switching stage 14. This is illustrated in more detail in FIG. 4

Figure 4:
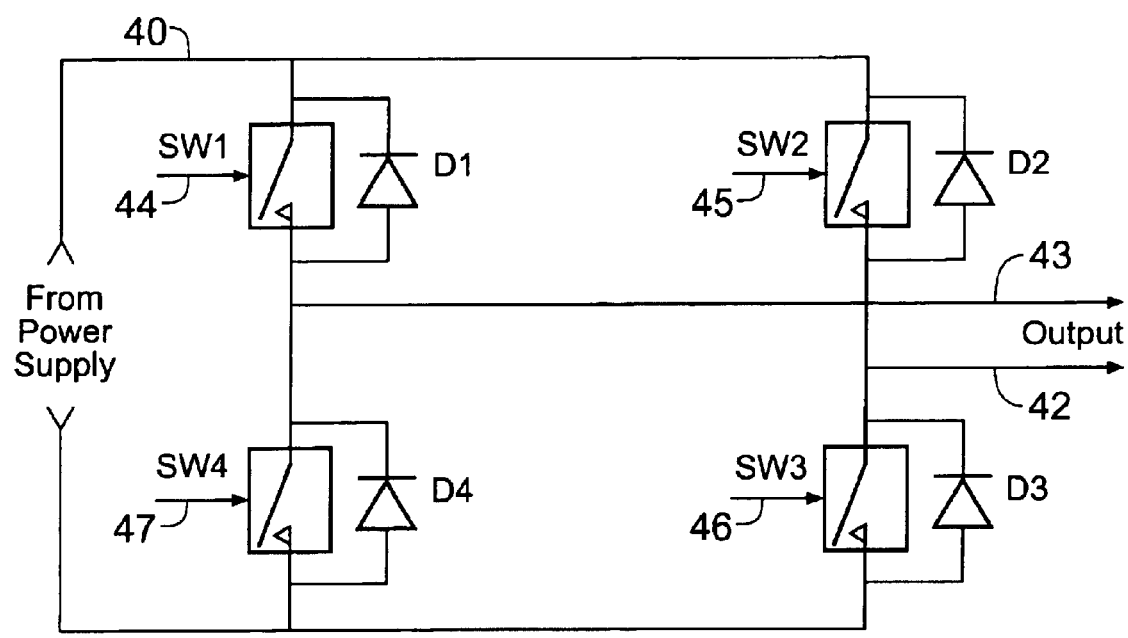
FIG. 4 is an example of a power switching stage which may be used in the embodiment of FIG. 1.

As can be seen from FIG. 4, the power switching stage 14 comprises four controllable power switching devices SW1, SW2, SW3 and SW4 connected across the inputs 40, 41 from the power supply 15, with the switching devices SW1 and SW4 in series, and the switching devices SW2 and SW3 in series. Diodes D1 to D4 are connected across each of the switching devices SW1 to SW4 respectively. These switching devices SW1 to SW4 may be eg power MOSFETs. The power switching stage 14 then generates an output between output lines 42 and 43, line 42 being connected to the junction of switching devices SW2 and SW3, and line 43 being connected to the junction of switching devices SW1 and SW4.

The switch control logic stage 13 then controls the switching of switching devices SW1 to SW4 to cause three different switching configurations. Each of switching devices SW1 to SW4 has respective control inputs 44 to 47 from the switch control logic stage 13, by which the switch control logic stage 13 passes the control signals to the power switching stage 14.

In the first switching configuration, the control signals are applied via lines 44 and 46 are such as to make switching devices SW1 and SW3 conductive. The control signals applied via lines 45 and 47 are effectively zero signals so switches SW2 and SW4 are non-conductive. In this state, the output across lines 42 and 43 is positive. In the second switching configuration, the control signals applied via lines 45 and 47 are such as to make switching devices SW2 and SW4 conductive. The control signals applied to lines 44 and 46 are zero, so switches SW1 and SW3 are not conductive. In this switching configuration the output is negative. The magnitude of the positive and negative outputs is the same, being equal to the magnitude of the voltage received from the power supply 15. The switching between first and second switching configurations merely reverses the polarity of that voltage.

However, there is a third switching state in which the output is zero. This can be achieved by applying suitable control signals to lines 46 and 47 to make switches SW3 and SW4 conductive, while control signals of zero level are applied to lines 44 and 45 so that switching devices SW1 and SW2 are non-conductive. The same state can be obtained, however, by applying suitable control signals to lines 44 and 45, and control signals of zero level to lines 46 and 47, so that the switches SW1 to SW4 are in the opposite configuration. In this configuration, there is also a zero output.

The three switching configurations thus described correspond to the possible levels of the output of the Δ-Σ modulator 12. When that output has only two levels, the switch control logic stage 13 generates control signals which are applied via lines 44 to 47 to switch between the first and second switching configurations. If the output from the Δ-Σ modulator has three levels, the switch control logic stage 13 produces control signals on lines 44 to 47 to generate all three switching configurations.

Thus, the first switching configuration is generated by the highest output state of the delta-sigma modulator 12, and generates an output voltage to the filter 15 which is equal in magnitude to the power supply voltage and is positive. When the output of the delta-sigma modulator 12 is at its lowest state, the power switching stage 13 produces an output voltage equal in magnitude to the power supply voltage, but in a negative direction. If there is an intermediate output stage from the delta-sigma modulator 12, the output from the power switching stage 14 to the output filter 16 is zero.

The power switching stage 14 shown in FIG. 4 is thus a full bridge circuit which has the advantage that its effective switching frequency can be twice that of the half-bridge, and the peak-to-peak swing is double the supply voltage. Power MOSFET driver ICs are available which can operate on a suitable maximum supply voltage and can simplify the circuitry required drive switching devices SW1 to SW4.

The output of the power switching stage 14, i.e. the output between lines 42 and 43 is then applied to the output filter-stage 16.

Figure 5:
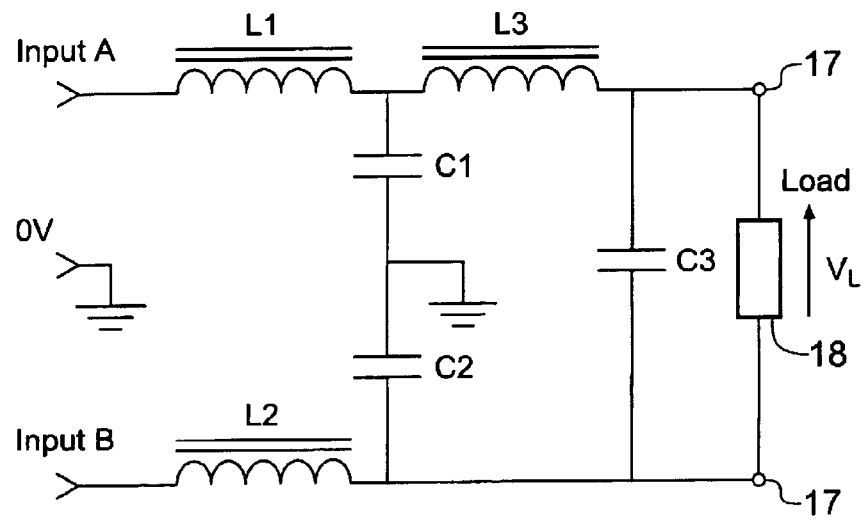
FIG. 5 is an example of an output filter which may be used in the embodiment of FIG. 1.

FIG. 5 illustrates the detailed structure of a filter which may be used as the output filter stage 16 in FIG. 1. The filter in FIG. 5 has two filtering stages, the first formed by inductances L1 and L2 and capacitances C1 and C2, and a second formed by inductance L3 and capacitance C3. Lines 42 and 43 in FIG. 4 may correspond to inputs A and B in FIG. 5 respectively.

The embodiment of FIG. 1 may be varied in several ways. Firstly, it has been found that second-order Δ-Σ modulators suffer from low-level artefacts such as idle tones and noise modulations. In order to overcome this, it has been suggested to apply a 'dither' to the quantization stage 21 or to apply variations to the feedback stages. These are discussed in the article entitled "A Comparison of Dithered and Chaotic Sigma-Delta Modulators" by C. Dunn et al published in J. Audio Eng. Soc., Vol. 44, No. 4, April 1996 pages 227 to 244.

In the embodiment of FIG. 1, the waveform generator generates a signal which is input to the Δ-Σ modulator 11. It is also known to use Δ-Σ arrangements as oscillators, enabling the generator 10 to be omitted. Such Δ-Σ oscillators are discussed in the article entitled "Delta-Sigma Oscillators: Versatile Building Blocks" by B. R. Veillette et al published in the National Journal of Circuit Theory and Applications, Vol. 25, (1997) page 407 to 418.

Figure 6:
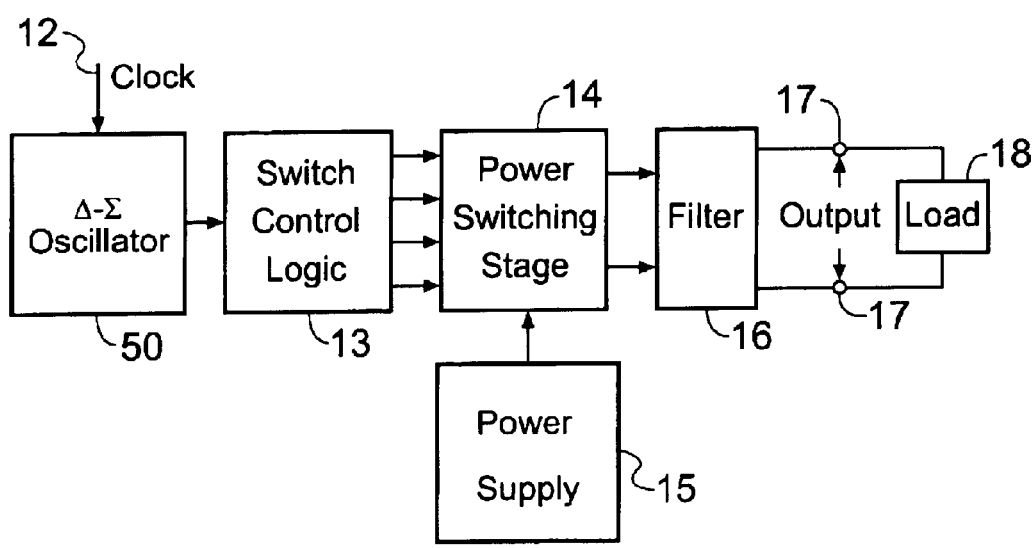
FIG. 6 is a schematic block diagram of a generator according to a second embodiment of the present invention.

FIG. 6 illustrates an embodiment using such a Δ-Σ oscillator. The embodiment is otherwise similar to the embodiment of FIG. 1, and corresponding parts are indicated by the same reference numerals. They will not be described in further detail. In the embodiment of FIG. 6 a Δ-Σ oscillator 50 receives a clock signal 12 and generates an output to the switch control logic stage 13 which is the same as that produced by the Δ-Σ modulator 11 in FIG. 1, when the input to the Δ-Σ modulator 11 from the waveform generator 10 is a sinusoidal waveform.

Figure 7:
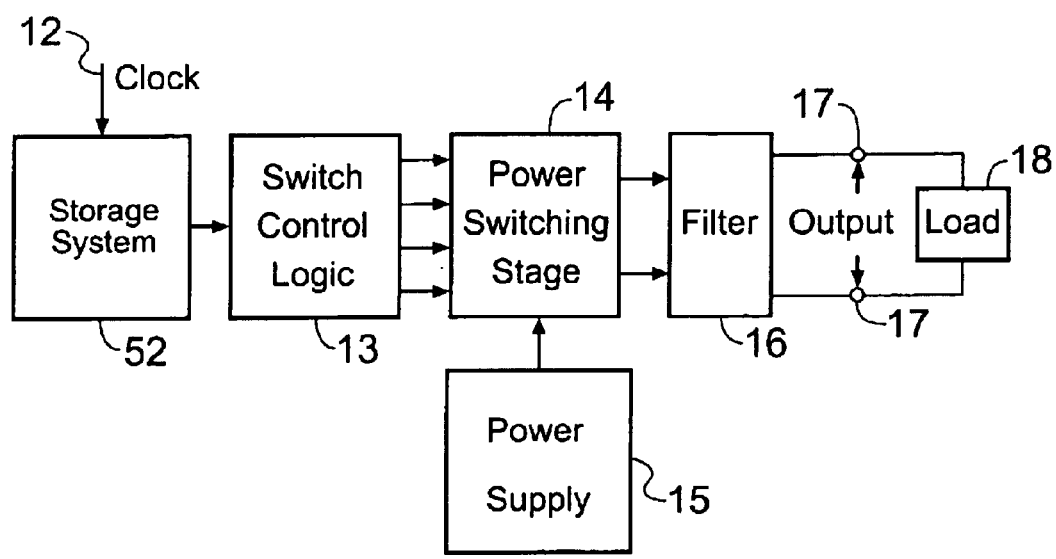
FIG. 7 is a schematic block diagram of a generator according to a third embodiment of the present invention.

The arrangement discussed above have assumed that the Δ-Σ modulation or oscillation is generated in real-time. However, this is not necessary and the present invention may be embodied in an arrangement in which a sample sequence of the output of the Δ-Σ modulator 11 in FIG. 1 is stored in a memory, and that sample sequence is subsequently repeatedly retrieved and successive retrievals output successively to form an input as a continuous sequence signal to the power switching stage 14. An embodiment of this type is illustrated in FIG. 7. Again, components which correspond to components of the embodiment of FIG. 1 are indicated by the same reference numerals, and will not be described in further detail. In the embodiment of FIG. 7, sample sequences are stored in memory 52, and retrieved under the influence of clock signal 12.

It will then not be necessary for the generator itself to contain the waveform generator 10 and the Δ-Σ modulator 11. Instead the effect of those components would be pre-generated and stored in the memory 52. Such signal sampling and retrieval arrangements are discussed in more detail in the article entitled Signal Generation Using Periodic Single and Multi-Bit Sigma-Delta Modulated Streams by B. Dufort et al published in Proceedings of the International Test Conference 1997 pages 396 to 405. By periodically repeating a sample sequence signal, an approximation to an infinite bitstream can be obtained.

Another alternative makes use of the fact that, in the embodiments described previously, the function of the switch control logic stage 13 is to generate control signals to the power switching stage 14, on the basis of the output from the Δ-Σ modulator. Therefore, it is possible to pre-generate the program corresponding to those control signals, to reproduce the generator output that would have been generated by a real time system in which a delta-sigma modulator 11 receives a desired waveform. If that program is then stored in a suitable memory device, and is periodically retrieved, the power switching stage 14 can be controlled exactly the same way as would occur in the real-time embodiment with reference to FIG. 1.

Figure 8:
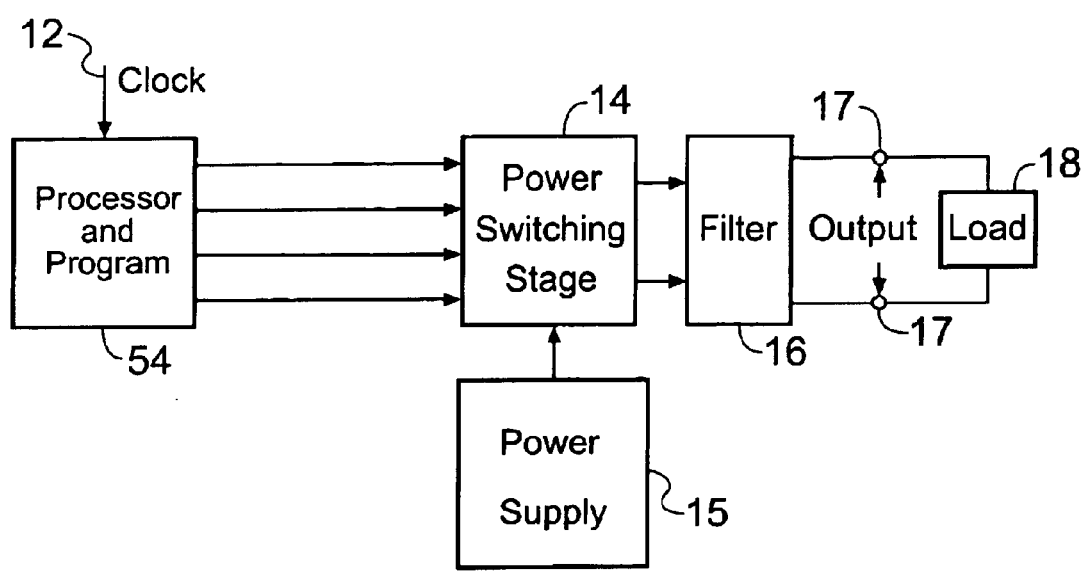
FIG. 8 is a schematic block diagram of a generator according to a fourth embodiment of the present invention.

An embodiment illustrating this is shown in FIG. 8. A processor 54 stores a program which generates appropriate control signals to the power switching stage 14. The program is such as to ensure that those control signals are the same as the control signals generated by the switch control logic 13 in the embodiment of FIG. 1, 6, or 7 under the influence of the Δ-Σ modulator 11, Δ-Σ oscillator 50 or storage unit 52.

Figure 9:
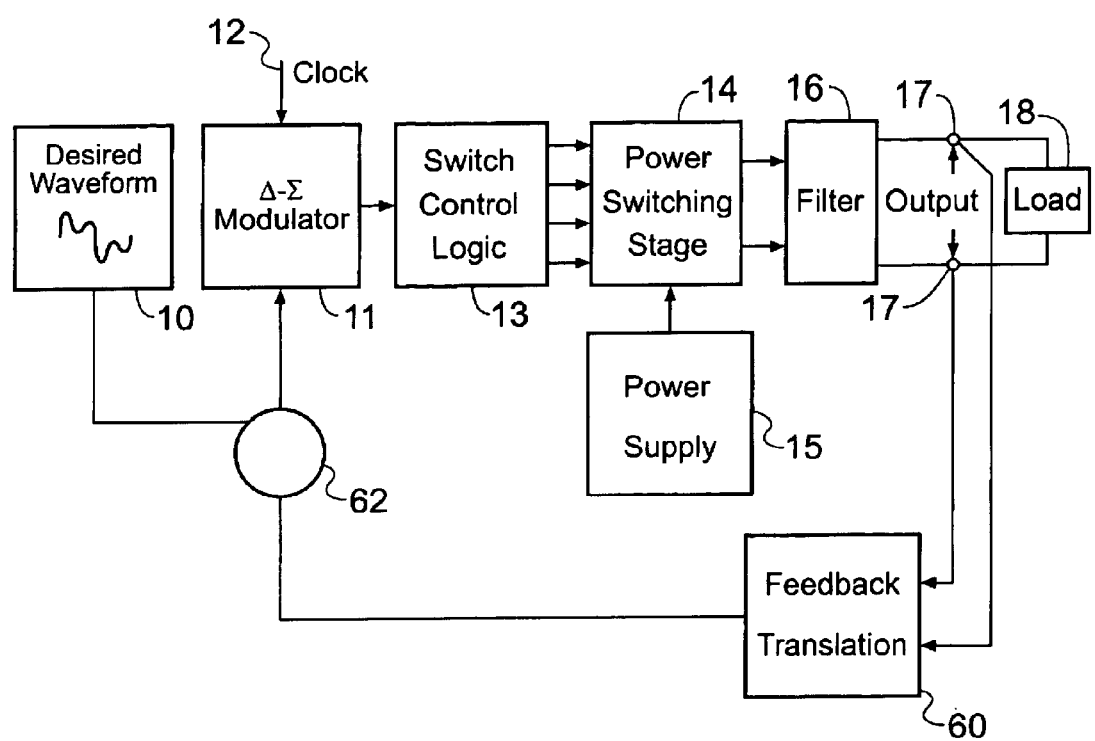
FIG. 9 is a schematic block diagram of a generator according to a fifth embodiment of the present invention.

It has previously been mentioned that the control of the generator output may be achieved by feedback arrangements. FIG. 9 illustrates an embodiment corresponding to FIG. 1, but incorporating such a feed back arrangement.

In the embodiment of FIG. 9, the output from output terminal 17 is fed to a feedback translation unit 60, from which appropriate control signals are generated to control the Δ-Σ modulator 11 and fed to an subtractor 62 which subtracts those signals from the output of the waveform generator 10, to form the resultant input to the Δ-Σ modulator 11. Apart from this, the embodiment of FIG. 9 is the same as the embodiment of FIG. 1, and corresponding parts are indicated by the same reference numerals.

Figure 10:
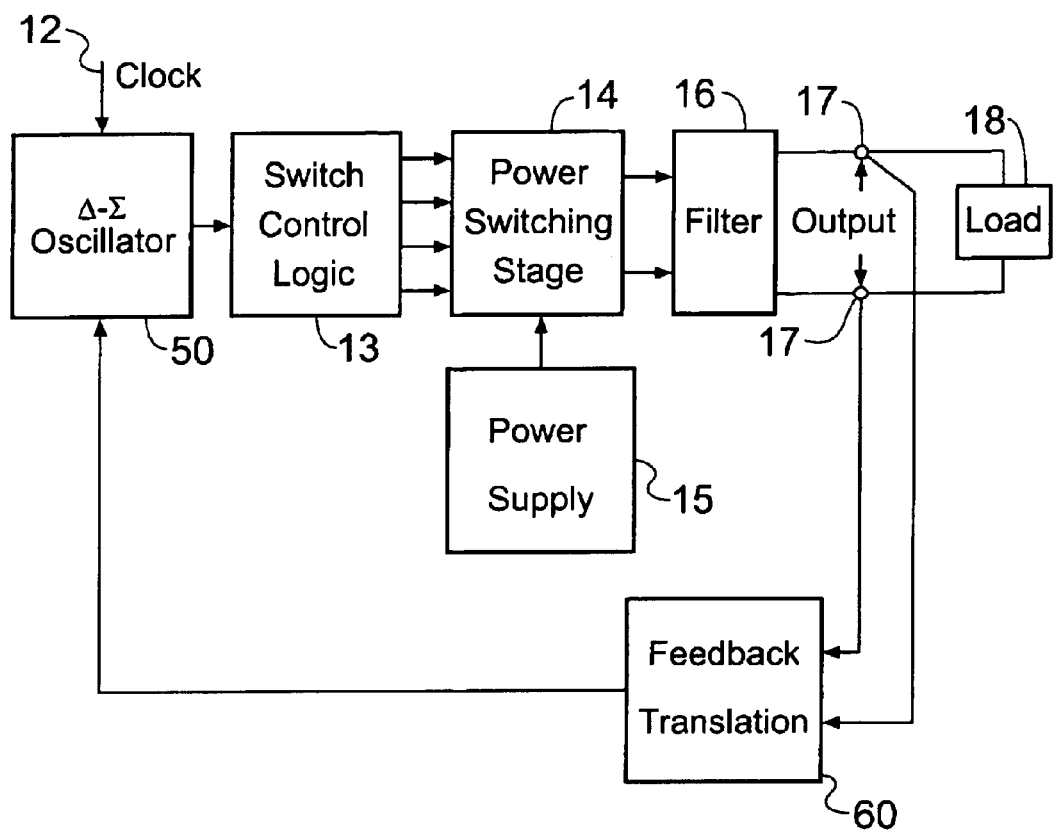
FIG. 10 is a schematic block diagram of a generator according to a sixth embodiment of the present invention.

A similar arrangement may be applied to the embodiment of FIG. 6, and this is illustrated in FIG. 10.

Again, parts corresponding to embodiments which have previously been described are indicated by the same reference numerals and will not be described in more detail now. In this embodiment, the output of the feedback translation unit 60 is fed directly to the Δ-Σ oscillator 50. Similarly, FIG. 11 illustrates an embodiment incorporating feedback, but which embodiment is otherwise similar to that of FIG. 8.

Figure 12:
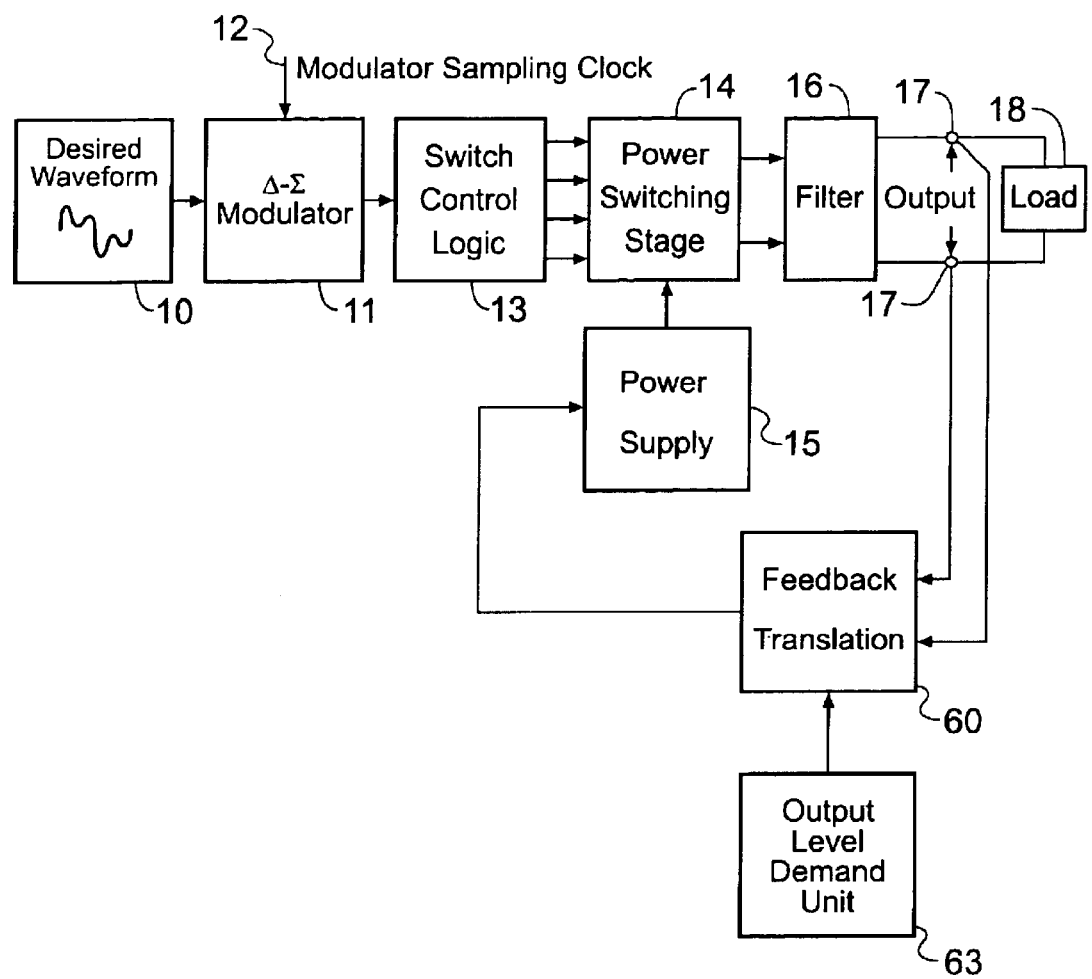
FIG. 12 is a schematic block diagram of a generator according to a eighth embodiment of the present invention.

It has also previously been mentioned that these feedback arrangements may be applied to the power supply, and FIG. 12 illustrates an embodiment of this. The embodiment of FIG. 12 is otherwise the same as the embodiment of FIG. 1, corresponding components are indicated by the same reference numbers. In the embodiment of FIG. 12, the output from the output terminal 17 is applied to a feedback translation unit 61, which generates an appropriate control signal to the power supply 15. That feedback translation unit 61 receives an input from an output level demand unit 63 which provides a signal representing the desired level at the output terminals 17. The feedback translation unit 61 then controls the power supply to achieve that desired output.

Figure 11:
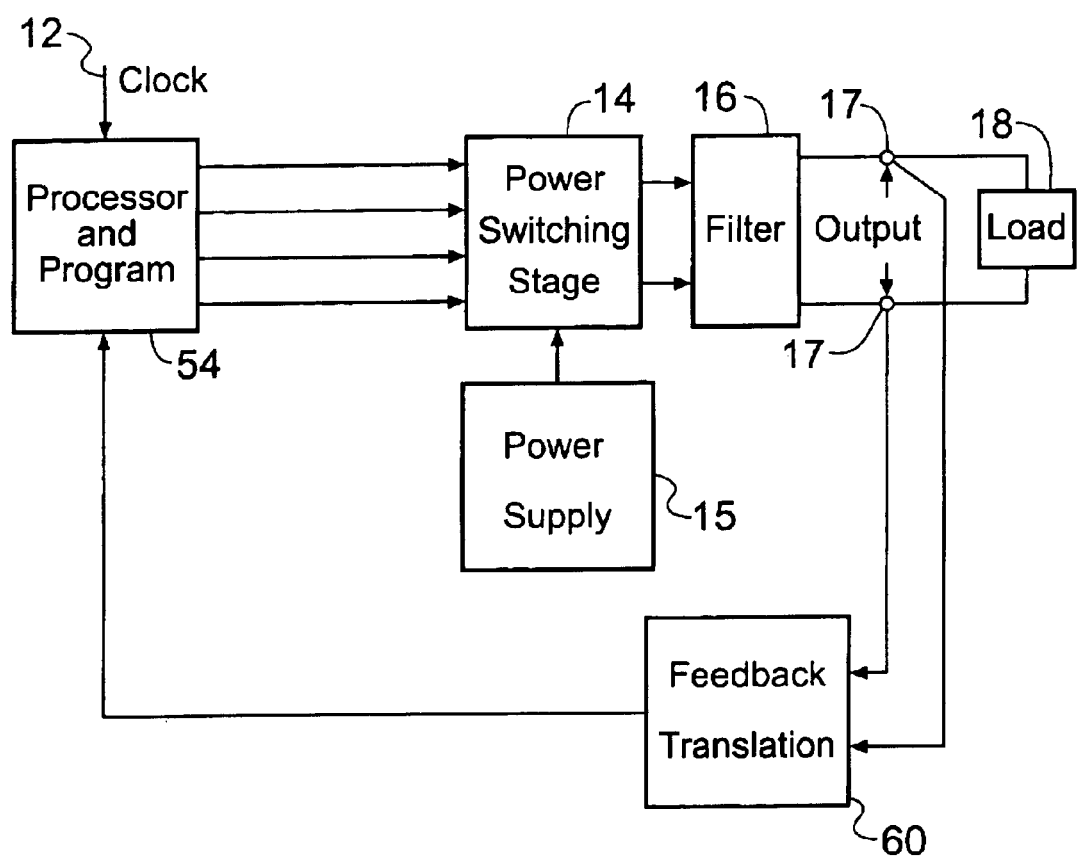
FIG. 11 is a schematic block diagram of a generator according to a seventh embodiment of the present invention.

Note that it is possible to combine feedback arrangements, to incorporate the feedback to the power supply as in the embodiment of FIG. 12, and the feedback to other components as in the embodiments of FIGS. 9 to 11.

What is claimed is:

1. A signal generator comprising:

a memory storing a signal corresponding to the output of a delta-sigma oscillator or generator, the memory being arranged to output a modulated signal a power supply;

a switching stage connected to the power supply and the memory for controlling the output of a power signal from said power supply on the basis of the modulated signal from the memory; and an output circuit for acting on the power signal to generate a generator output signal.

2. A signal generator comprising:

a processor storing a program representing the control of a switching stage using the output of a delta-sigma oscillator or generator;

a power supply;

a switching stage connected to the processor for control thereby under the effect of the program, the switching stage being arranged to control the output of a power signal from said power supply; and an output circuit for acting on the power signal to generate a generator output signal.

* * * * *